US008810282B2

(12) United States Patent
Li

(10) Patent No.: US 8,810,282 B2
(45) Date of Patent: Aug. 19, 2014

(54) APPARATUS AND METHODS FOR VOLTAGE COMPARISON

(71) Applicant: Analog Devices, Inc., Norwood, MA (US)

(72) Inventor: Hongxing Li, Tokyo (JP)

(73) Assignee: Analog Devices Inc., Norwood, MA (US)

( * ) Notice: Subject to any disclaimer, the term of this patent is extended or adjusted under 35 U.S.C. 154(b) by 0 days.

(21) Appl. No.: 13/725,631

(22) Filed: Dec. 21, 2012

(65) Prior Publication Data

US 2014/0176356 A1      Jun. 26, 2014

(51) Int. Cl.
*H03K 5/22*      (2006.01)
(52) U.S. Cl.
USPC ............... 327/65; 327/54; 327/55; 327/67
(58) Field of Classification Search
CPC ............ H03F 2203/45322; H03F 2203/45514; H03F 2203/45546; H03F 2203/45532
USPC ........... 327/65, 52, 54, 55, 56, 67, 68, 69, 71, 327/74, 77, 78, 79, 85, 89
See application file for complete search history.

(56) References Cited

U.S. PATENT DOCUMENTS 7,173,457 B2 *    2/2007   Kawasumi ...................... 327/55
8,497,711 B2 *    7/2013   Hsieh ............................. 327/58

OTHER PUBLICATIONS

Miyahara et al., *A Low-Noise Self-Calibrating Dynamic Comparator for High-Speed ADC's*, IEEE Asian Solid-State Circuits Conference, Nov. 3-5, 2008, pp. 269-272.
Schinkel et al., *A Double-Tail Latch-Type Voltage Sense Amplifier with 18ps Setup+Hold Time*, ISSCC 2007 / Session 17 / Analog Techniques and PLLs / 17.7, 2007 IEEE International Solid-State Circuits Conference, pp. 314-315, and 605.

* cited by examiner

*Primary Examiner* — Lincoln Donovan
*Assistant Examiner* — Jung H Kim
(74) *Attorney, Agent, or Firm* — Knobbe, Martens, Olson & Bear, LLP

(57) ABSTRACT

Apparatus and methods for voltage comparison are provided. In one embodiment, a comparator includes a first input transistor having a gate configured to receive a first input voltage and a second input transistor having a gate configured to receive a second input voltage. The first and second input transistors can be used to compare the first input voltage to the second input voltage. Additionally, the comparator further includes a first Miller capacitor electrically connected to a drain of the first input transistor and a second Miller capacitor electrically connected to a drain of the second input transistor. Furthermore, first and second inverting amplification circuits are electrically connected across the first and second Miller capacitors, respectively, so as to increase the effective capacitance of the capacitors. The first and second Miller capacitors can be used to extend the comparator's integration time, thereby enhancing the performance of the comparator.

21 Claims, 9 Drawing Sheets

APPARATUS AND METHODS FOR VOLTAGE COMPARISON

BACKGROUND

1. Field

Embodiments of the invention relate to electronic devices, and more particularly, to comparators.

2. Description of the Related Technology

Certain electronic systems can include a comparator for comparing one input voltage to another input voltage. For example, an analog-to-digital converter (ADC) can include one or more comparators for comparing an input voltage signal to a reference voltage and/or for comparing one input voltage signal to another input voltage signal.

The performance of a comparator, such as the comparator's noise and/or input offset, can impact the overall performance of the electronic system that the comparator is used in. The comparator's impact on overall operation can be exacerbated in configurations using multiple comparators. For instance, an n-bit flash ADC can include $2^n-1$ comparators used for determining a digital value of an analog signal. For example, in a flash ADC, a first input voltage for a comparator can correspond to an input voltage that is being converted from analog to digital, and a second input voltage can be a voltage from a voltage divider network.

Accordingly, there is a need for improved comparators, including for example, comparators having smaller size, reduced power consumption, low noise, and/or low input offset.

SUMMARY

In one embodiment, a comparator includes a first comparator stage configured to receive a first input voltage and a second input voltage. The first comparator stage includes a first input transistor, a second input transistor, a first inverting gain circuit, a second inverting gain circuit, a first capacitor, and a second capacitor. A gate of the first input transistor is configured to receive the first input voltage, and a gate of the second input transistor is configured to receive the second input voltage. Additionally, a source of the first input transistor is electrically connected to a source of the second input transistor. The first inverting gain circuit includes an input and an output, and the input of the first inverting gain circuit is electrically connected to a drain of the first input transistor. The first capacitor includes a first end electrically connected to the drain of the first input transistor and a second end electrically connected to the output of the first inverting gain circuit. The second inverting gain circuit includes an input and an output, and the input of the second inverting gain circuit is electrically connected to a drain of the second input transistor. The second capacitor includes a first end electrically connected to the drain of the second input transistor and a second end electrically connected to the output of the second inverting gain circuit.

In another embodiment, a method of comparing a first input voltage to a second input voltage is provided. The method includes receiving the first input voltage at a gate of a first input transistor and receiving the second input voltage at a gate of a second input transistor. A source of the first input transistor is electrically connected to a source of the second input transistor. Additionally, the method includes biasing the first and second input transistors with a bias current in response to a clock signal and controlling a first portion of the bias current through the first input transistor relative to a second portion of the bias current through the second input transistor based on a voltage difference between the first and second input voltages. The method further includes loading a drain of the first input transistor using a first capacitance and a first inverting gain circuit. The first inverting gain circuit includes an input electrically connected to the drain of the first input transistor and an output, and the first capacitance is operatively coupled between the drain of the first input transistor and the output of the first inverting gain circuit. The method further includes loading a drain of the second input transistor using a second capacitance and a second inverting gain circuit. The second inverting gain circuit includes an input electrically connected to the drain of the second input transistor and an output, and the second capacitance is operatively coupled between the drain of the second input transistor and the output of the second inverting gain circuit.

In another embodiment, analog-to digital converter is provided. The analog-to-digital converter includes a comparator configured to receive a first input voltage and a second input voltage. The comparator includes a first input transistor, a second input transistor, a first inverting gain circuit, a second inverting gain circuit, a first capacitor, and a second capacitor. A gate of the first input transistor is configured to receive the first input voltage, and a gate of the second input transistor is configured to receive the second input voltage. Additionally, a source of the first input transistor is electrically connected to a source of the second input transistor. The first inverting gain circuit includes an input and an output, and the input of the first inverting gain circuit is electrically connected to a drain of the first input transistor. The first capacitor includes a first end electrically connected to the drain of the first input transistor and a second end electrically connected to the output of the first inverting gain circuit. The second inverting gain circuit includes an input and an output, and the input of the second inverting gain circuit is electrically connected to a drain of the second input transistor. The second capacitor includes a first end electrically connected to the drain of the second input transistor and a second end electrically connected to the output of the second inverting gain circuit.

DETAILED DESCRIPTION OF EMBODIMENTS

Figure 1:
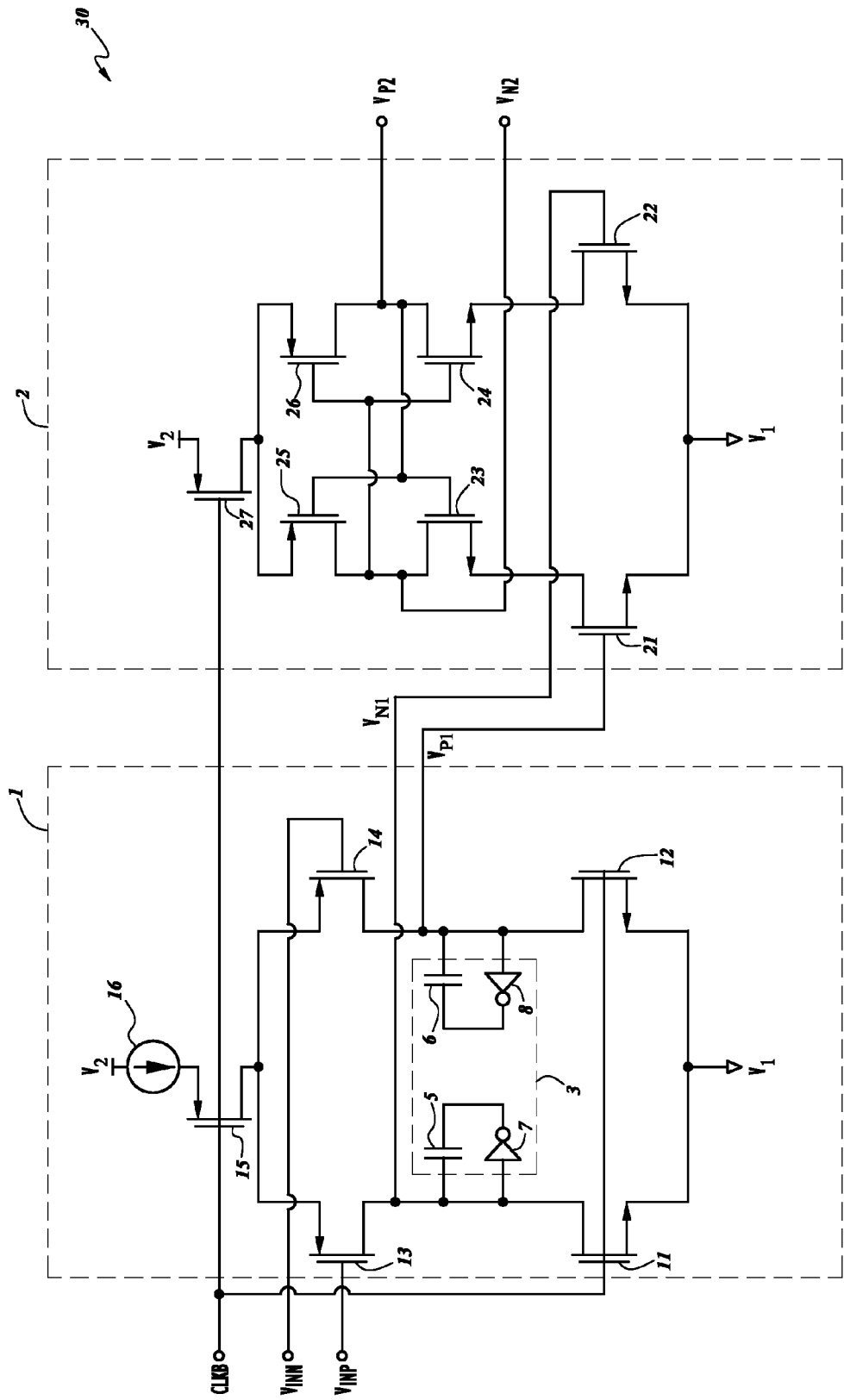
FIG. 1 is a circuit diagram of one embodiment of a comparator.

The following detailed description of embodiments presents various descriptions of specific embodiments of the invention. However, the invention can be embodied in a multitude of different ways as defined and covered by the claims.

In this description, reference is made to the drawings where like reference numerals indicate identical or functionally similar elements.

Overview of Comparator Circuits

Apparatus and methods for voltage comparison are provided. In certain implementations, a comparator includes a first input transistor having a gate configured to receive a first input voltage and a second input transistor having a gate configured to receive a second input voltage. The first and second input transistors can be used to compare the first input voltage to the second input voltage. Additionally, the comparator further includes a first Miller capacitor electrically connected to a drain of the first input transistor and a second Miller capacitor electrically connected to a drain of the second input transistor. The first and second Miller capacitors correspond to explicitly added capacitances and not merely to parasitic capacitances. Furthermore, first and second inverting amplification circuits are electrically connected across the first and second Miller capacitors, respectively, so as to increase the effective capacitance of the capacitors. The first and second Miller capacitors can be used to extend the comparator's integration time, thereby reducing the comparator's noise, power consumption, and/or area relative to a configuration that does not take advantage of Miller capacitors.

FIG. 1 is a circuit diagram of one embodiment of a comparator 30. The comparator 30 includes a first or input comparator stage 1 and a second or output comparator stage 2. The first comparator stage 1 is configured to receive a first input voltage $V_{INP}$ and a second input voltage $V_{INN}$. The first comparator stage 1 is further configured to generate a first differential output signal ($V_{P1}-V_{N1}$) corresponding to a difference between a first non-inverted output signal $V_{P1}$ and a first inverted output signal $V_{N1}$. The second comparator stage 2 is configured to receive the first differential output signal ($V_{P1}-V_{N1}$) and to generate a second differential output signal ($V_{P2}-V_{N2}$) corresponding to a difference between a second non-inverted output signal $V_{P2}$ and a second inverted output signal $V_{N2}$.

The first comparator stage 1 includes a Miller circuit 3, a first n-type metal oxide semiconductor (NMOS) precharge transistor 11, a second NMOS precharge transistor 12, a first p-type metal oxide semiconductor (PMOS) input transistor 13, a second PMOS input transistor 14, a first PMOS clocked transistor 15, and a current source 16. The Miller circuit 3 includes a first Miller capacitor 5, a second Miller capacitor 6, a first inverter 7, and a second inverter 8. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The first PMOS input transistor 13 includes a gate configured to receive the first input voltage $V_{INP}$, and the second PMOS input transistor 14 includes a gate configured to receive the second input voltage $V_{INN}$. The first PMOS input transistor 13 further includes a drain electrically connected to an input of the first inverter 7, to a first end of the first Miller capacitor 5, and to a drain of the first NMOS precharge transistor 11 at a node configured to generate the first inverted output signal $V_{N1}$. The first inverter 7 further includes an output electrically connected to a second end of the first Miller capacitor 5. The second PMOS input transistor 14 further includes a drain electrically connected to an input of the second inverter 8, to a first end of the second Miller capacitor 6, and to a drain of the second NMOS precharge transistor 12 at a node configured to generate the first non-inverted output signal $V_{P1}$. The second inverter 8 further includes an output electrically connected to a second end of the second Miller capacitor 6.

The first and second NMOS precharge transistors 11, 12 each further include a gate configured to receive the inverted clock signal CLKB, which can be used to activate or deactivate the comparator 30 as will be described further below. The first and second NMOS precharge transistors 11, 12 each further include a source electrically connected to a first supply voltage $V_1$, which can be, for example, a ground or power low supply. The first PMOS clocked transistor 15 includes a drain electrically connected to a source of the first PMOS input transistor 13 and to a source of the second PMOS input transistor 14. The first PMOS clocked transistor 15 further includes a gate configured to receive the inverted clock signal CLKB and a source electrically connected to a first terminal of the current source 16. The current source 16 further includes a second terminal electrically connected to a second supply voltage $V_2$, which can be, for example, a power high supply.

The second comparator stage 2 includes a first NMOS input transistor 21, a second NMOS input transistor 22, first and second NMOS output transistors 23, 24, first and second PMOS output transistors 25, 26, and a second PMOS clocked transistor 27. The first NMOS input transistor 21 includes a source electrically connected to the first supply voltage $V_1$, a gate configured to receive the first non-inverted output signal $V_{P1}$, and a drain electrically connected to a source of the first NMOS output transistor 23. The second NMOS input transistor 22 includes a source electrically connected to the first supply voltage $V_1$, a gate configured to receive the first inverted output signal $V_{N1}$, and a drain electrically connected to a source of the second NMOS output transistor 24. The second PMOS clocked transistor 27 includes a source electrically connected to the second supply voltage $V_2$, a gate configured to receive the inverted clock signal CLKB, and a drain electrically connected to a source of the first PMOS output transistor 25 and to a source of the second PMOS output transistor 26. The first PMOS output transistor 25 further includes a drain electrically connected to a drain of the first NMOS output transistor 23, to a gate of the second NMOS output transistor 24, and to a gate of the second PMOS output transistor 26 at a node configured to generate the second inverted output signal $V_{N2}$. The second PMOS output transistor 26 further includes a drain electrically connected to a drain of the second NMOS output transistor 24, to a gate of the first NMOS output transistor 23, and to a gate of the first PMOS output transistor 25 at a node configured to generate the second non-inverted output signal $V_{P2}$.

The comparator 30 can be used to compare the first input voltage $V_{INP}$ to the second input voltage $V_{INN}$. For example, when the inverted clock signal CLKB is in a high state, the first and second NMOS precharge transistors 11, 12 can precharge the nodes associated with the first non-inverted and first inverted output signals $V_{P1}, V_{N1}$ to a voltage about equal to the first supply voltage $V_1$. Additionally, when the inverted clock signal CLKB transitions from a high state to a low state, the first and second PMOS clocked transistors 15, 27 can turn on and the first and second NMOS precharge transistors 11, 12 can turn off. Thereafter, the first and second PMOS input transistors 13, 14 can be biased with a current of the current source 16, and the first and second PMOS input transistors 13, 14 can operate as a differential transistor pair in which the flow of current through the first PMOS input transistor 13 relative to the second PMOS input transistor 14 can be based on a voltage difference between the first and second input voltages $V_{INP}, V_{INN}$. For example, when the first input voltage $V_{INP}$ is larger than the second input voltage $V_{INN}$, the current through the second PMOS input transistor 14 can be greater than the current through the first PMOS input transistor 13, which can result in the first non-inverted output signal $V_{P1}$ rising faster than the first inverted output signal $V_{N1}$. Additionally, when the first input voltage $V_{INP}$ is less than the second input voltage $V_{INN}$, the current through the first PMOS input transistor 13 can be greater than the current through the second PMOS input transistor 14, which can result in the first inverted output signal $V_{N1}$ rising faster than the first non-inverted output signal $V_{P1}$.

Accordingly, the first non-inverted and/or first inverted output signals $V_{P1}$, $V_{N1}$ can rise when the inverted clock signal CLKB activates the comparator 30. Additionally, when the first non-inverted output signal $V_{P1}$ rises faster than the first inverted output signal $V_{N1}$, the first NMOS input transistor 21 can turn on before the second NMOS input transistor 22, thereby latching the NMOS and PMOS output transistors 23-26 in a state associated with the second non-inverted output signal $V_{P2}$ being high and the second inverted output signal $V_{N2}$ being low. Furthermore, when the first inverted output signal $V_{N1}$ rises faster than the first non-inverted output signal $V_{P1}$, the second NMOS input transistor 22 can turn on before the first NMOS input transistor 21, thereby latching the NMOS and PMOS output transistor 23-26 in a state associated with the second non-inverted output signal $V_{P2}$ being low and the second inverted output signal $V_{N2}$ being high. Accordingly, the comparator 30 can be used to compare the first input signal $V_{INP}$ to the second input signal $V_{INN}$, and to generate an output signal based on the result of the comparison.

The first inverter 7 is electrically connected across the first Miller capacitor 5 and the second inverter 8 is electrically connected across the second Miller capacitor 6. In the illustrated configuration, the first ends or top plates of the first and second Miller capacitors 5, 6 can be precharged to about the voltage of the first supply voltage $V_1$, and the second ends or bottom plates of the first and second Miller capacitors 5, 6 can be precharged to about the voltage of the second supply voltage $V_2$. Precharging the first and second Miller capacitors 5, 6 in this manner can extend the comparator's integration time by a factor of about $(V_2-V_1+V_T)/V_T$, where $V_2$ is the voltage of the second supply voltage $V_2$, $V_1$ is the voltage of the first supply voltage $V_1$, and $V_T$ is the trip point of the first and second inverters 7, 8. For example, when the first and second Miller capacitors 5, 6 have a capacitance C, it can take an amount of charge about equal to $(V_2-V_1+V_T)*C$ to charge the capacitors' top plates from $V_1$ to $V_T$ and to discharge the capacitors' bottom plates from $V_2$ to $V_1$. Since this amount of charge is greater than $V_T*C$., the first and second Miller capacitors 5, 6 can have an increased effective capacitance about equal to $(V_2-V_1+V_T)/V_T$. The increased effective capacitance can correspond to an increase in the comparator's integration time.

The illustrated configuration includes first and second inverters 7, 8 configured to operate as first and second inverting amplification circuits, respectively. The first and second inverters 7, 8, can be, for example, CMOS digital inverters. Although the first and second inverters 7, 8 illustrate one example of inverting amplification circuits suitable for use with the comparators described herein, other configurations of inverting amplification circuits can be used, including, for example, the configuration described further below with reference to FIG. 8.

As described above, the first and second Miller capacitors 5, 6 can be used to extend the comparator's integration time relative to a configuration that does not take advantage of Miller capacitors. For example, when the first inverted output signal $V_{N1}$ increases and reaches the trip point of the first inverter 7, the voltage of the first inverted output signal $V_{N1}$ can clamp while the first inverter 7 is transitioning. Similarly, when the first non-inverted output signal $V_{P1}$ increases and reaches the trip point of the second inverter 8, the voltage of the first non-inverted output signal $V_{P1}$ can clamp while the second inverter 8 is transitioning. As used herein, the period of time in which the first and/or second inverters 7, 8 are transitioning can be referred to as the comparator's "Miller phase." Although the voltages of the first non-inverted and first inverted output signals $V_{P1}$, $V_{N1}$ can be clamped during the comparator's Miller phase, the differential accumulated charge on the first and second Miller capacitors 5, 6 can continue to increase. Thus, when the Miller phase completes, substantially all of the charge difference can appear as a voltage difference between the first non-inverted and first inverted output signals $V_{P1}$, $V_{N1}$. Thus, the first and second Miller capacitors 5, 6 can be used to extend the comparator's integration time.

In certain implementations, the first and second NMOS input transistors 21, 22 of the second comparator stage 2 have a threshold voltage that is greater than a trip point of the first and second inverters 7, 8. For example, the threshold voltage of the first and second NMOS input transistors 21, 22 can be greater than the threshold voltage of NMOS transistors used to implement the first and second inverters 7, 8. Configuring the first and second NMOS input transistors 21, 22 in this manner can aid in preventing the second comparator stage 2 from activating during the comparator's Miller phase, thereby helping to ensure the comparator's integration time is extended.

In one embodiment, the first and second Miller capacitors 5, 6 each have a capacitance in the range of about 1 fF to about 10 fF, for example, about 6 fF. However, skilled artisans will readily ascertain other suitable capacitance values, including, for example, capacitance values based on a comparator's power and/or noise specifications.

As described above, the comparator 30 can be used to compare the first input voltage $V_{INP}$ to the second input voltage $V_{INN}$. The first and second input voltages $V_{INP}$, $V_{INN}$ can be any suitable input voltages. For example, in certain implementations, the first input voltage V can be an input voltage signal and the second input voltage $V_{INN}$ can be a reference voltage. However, other configurations are possible, such as implementations in which the first input voltage $V_{INP}$ is a first input voltage signal and the second input voltage $V_{INN}$ is a second input voltage signal.

The comparator 30 can have a smaller area relative to a comparator using non-Miller capacitors as loads to the drains of the first and second PMOS input transistors 13, 14. For example, simulations for one particular implementation of the comparator 30 with an NMOS threshold voltage of about 0.5 V for the first and second inverters 7, 8 and a voltage difference between the first and second supply voltages $V_1$, $V_2$ of about 1.2 V showed that the first and second Miller capacitors 5, 6 can reduce a capacitor size by a factor of about 3.4 relative to a configuration in which non-Miller capacitors are used.

The illustrated comparator 30 includes only one active input transistor pair in the first comparator stage 1, and thus can have a relatively low offset and noise relative to configurations using multiple active input transistor pairs. Providing low input offset can avoid or reduce a complexity of offset calibration circuitry, which can increase overall circuit area and power consumption. Additionally, using the first and second Miller capacitors 5, 6 can also help reduce the comparator's noise relative to a configuration using non-Miller capacitors of about the same size. For example, the noise of the comparator 30 can be reduced by increasing the load capacitance of the first and second PMOS input transistors 13, 14. Since the first and second Miller capacitors 5, 6 can have a greater effective capacitance per unit area than non-Miller capacitors, using the first and second Miller capacitors 5, 6 in the comparator 30 can lower the comparator's overall noise.

Although FIG. 1 illustrates one particular configuration of the comparator 30, the comparator 30 can be adapted or modified in other ways. For example, other configurations of timing circuitry, pre-charge circuitry, and/or output circuitry can be used.

Figure 2:
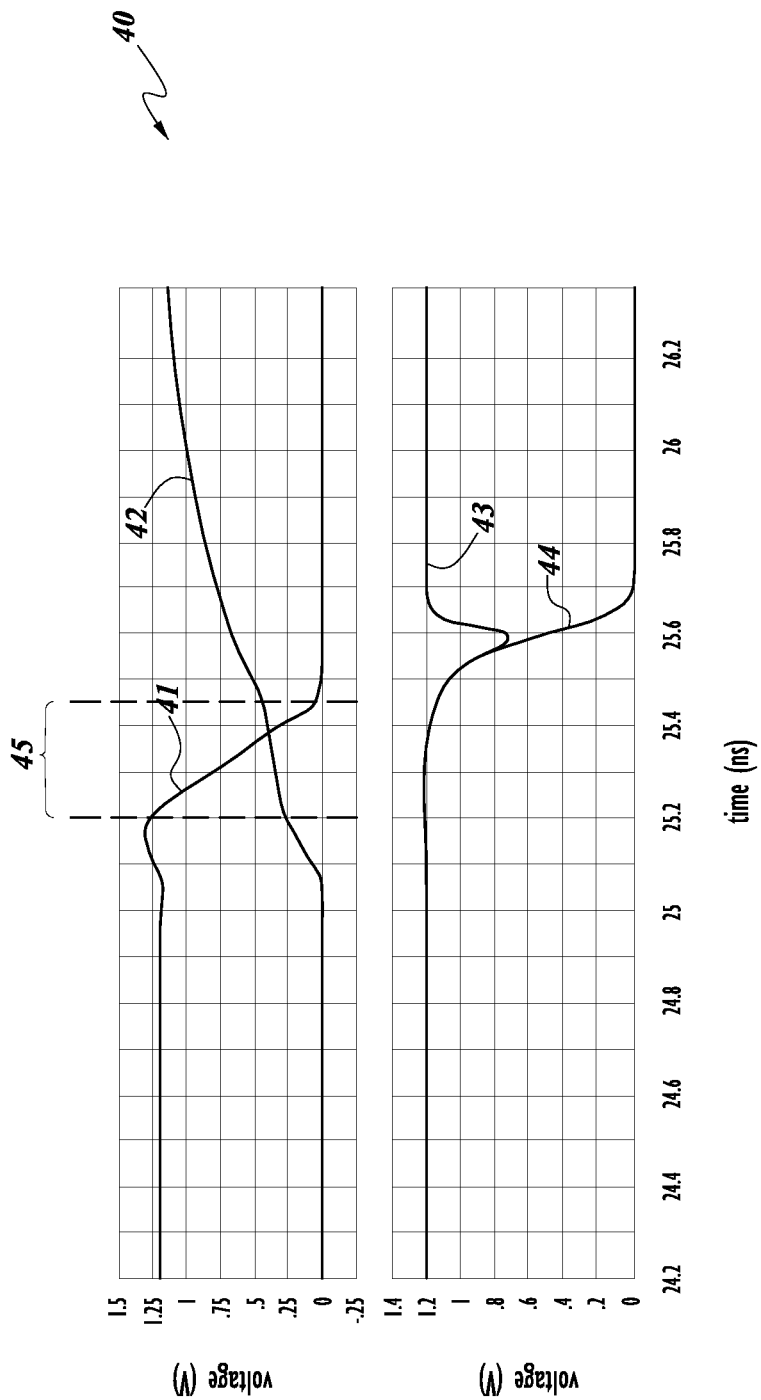
FIG. 2 is a graph of one example of simulation results for the comparator of FIG. 1.

FIG. 2 is a graph 40 of one example of simulation results for the comparator 30 of FIG. 1. The graph 40 includes a first plot 41 of the voltage of the output of the first inverter 7 versus time, a second plot 42 of the voltage of the first inverted output signal $V_{N1}$ versus time, a third plot 43 of the voltage of the second inverted output signal $V_{N2}$ versus time, and a fourth plot 44 of the voltage of the non-inverted output signal $V_{P2}$ versus time. The graph 40 has also been annotated to denote a Miller phase 45 of the comparator 30. The graph 40 corresponds to one example of simulation results of the comparator 30 based on specific device and component sizes and for specific values of supply voltages. However, other configurations are possible.

With reference to FIGS. 1 and 2, the graph 40 corresponds to a simulation in which the comparator 30 is activated at a time about equal to 25 ns, and in which the first input voltage V is less than the second input voltage $V_{INN}$. As shown in the second plot 42 of FIG. 2, the voltage of the first inverted output signal $V_{N1}$ can begin to increase or ramp up when the comparator 30 is activated. Once the first inverted output signal $V_{N1}$ reaches a trip point of the first inverter 7, the output voltage of the first inverter 7 can begin to transition, which can increase the effective capacitance of the first Miller capacitor 5 and clamp or slow the increase of the voltage of the first inverted output signal $V_{N1}$ during the Miller phase 45. After the Miller phase 45 completes, the voltage of the first inverted output signal $V_{N1}$ can increase beyond the trip point of the second NMOS input transistor 22. As shown in the third and fourth plots 43, 44, after the second NMOS input transistor 22 activates the NMOS and PMOS output transistors 23-26 can latch in a state associated with the second non-inverted output signal $V_{P2}$ being low and the second inverted output $V_{N2}$ being high.

Figure 3:
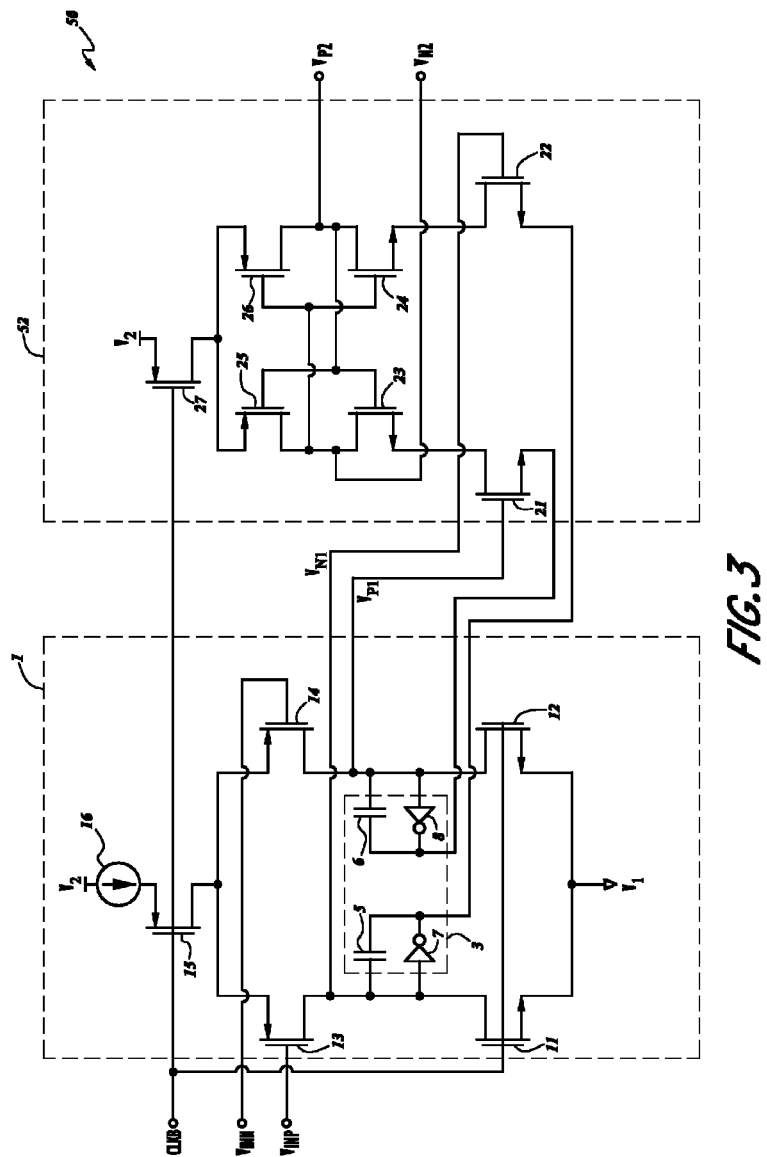
FIG. 3 is a circuit diagram of another embodiment of a comparator.

FIG. 3 is a circuit diagram of another embodiment of a comparator 50. The comparator 50 includes the first comparator stage 1, which can be as described earlier with respect to FIG. 1. The comparator 50 further includes a second comparator stage 52, which is similar to the second comparator stage 2 of FIG. 1, except that the second comparator stage 52 includes a different arrangement of the first and second NMOS input transistors 21, 22. In particular, the comparator 50 illustrates a configuration in which the source of the first NMOS input transistor 21 is electrically connected to the output of the second inverter 8 and in which the source of the second NMOS input transistor 22 is electrically connected to the output of the first inverter 7. Configuring the second comparator stage 52 in this manner can aid in preventing the second comparator stage 52 from activating until the comparator's Miller phase has completed. Additional details of the comparator 50 can be similar to those described earlier.

Figure 4:
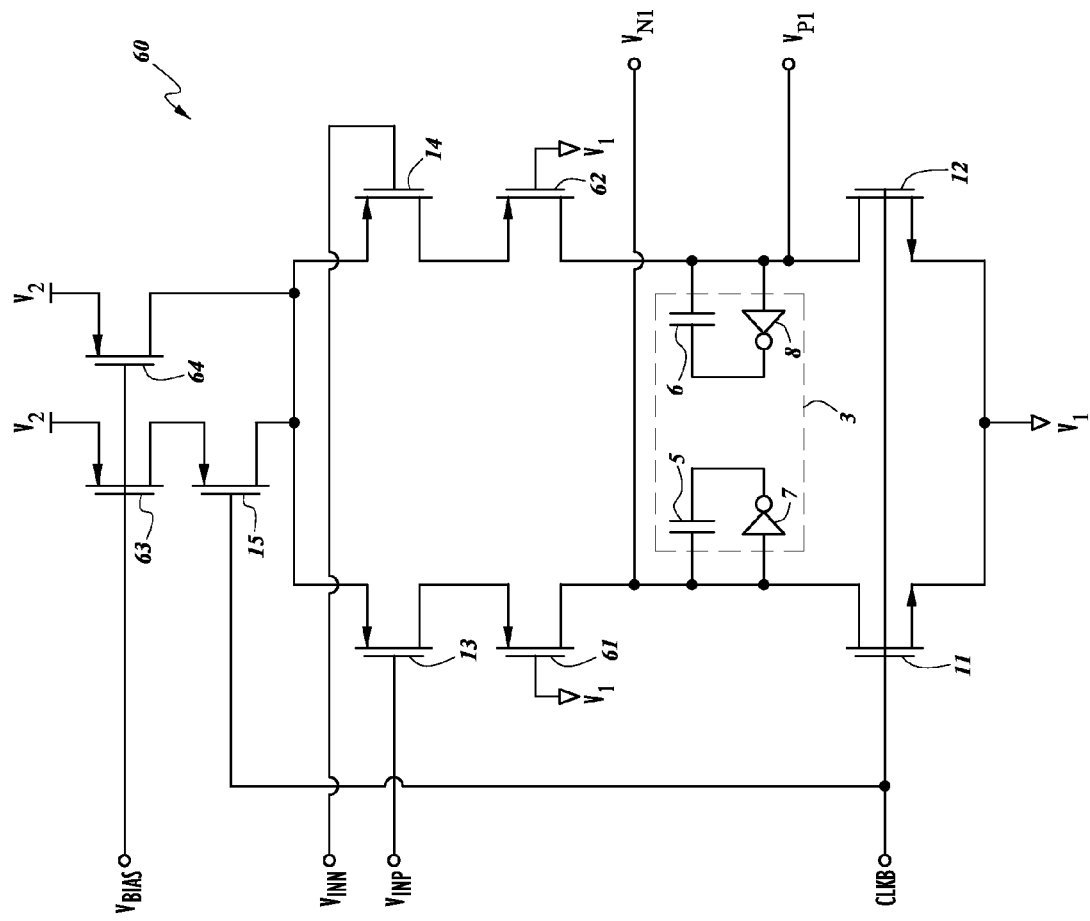
FIG. 4 is a circuit diagram of one embodiment of a comparator stage.

FIG. 4 is a circuit diagram of one embodiment of a comparator stage 60. The comparator stage 60 is similar to the first comparator stage 1 of FIG. 1, except that the comparator stage 60 further includes a first PMOS current source transistor 63, a second PMOS current source transistor 64, a first PMOS cascode transistor 61, and a second PMOS cascode transistor 62. In the illustrated configuration, the first PMOS current source transistor 63 has been used to implement the current source 16 of FIG. 1.

The first PMOS current source transistor 63 includes a gate configured to receive a bias voltage $V_{BIAS}$, a source electrically connected to the second supply voltage $V_2$, and a drain electrically connected to a source of the first PMOS clocked transistor 15. The second PMOS current source transistor 64 includes a gate configured to receive the bias voltage $V_{BIAS}$, a source electrically connected to the second supply voltage $V_2$, and a drain electrically connected to the drain of the first PMOS clocked transistor 15 and to the sources of the first and second PMOS input transistors 13, 14. The first and second PMOS cascode transistors 61, 62 have been disposed in an electrical path between the drains of the first and second input transistors 13, 14 and the first ends of the first and second Miller capacitors 5, 6, respectively. For example, the first PMOS cascode transistor 61 includes a source electrically connected to the drain of the first PMOS input transistor 13, a gate electrically connected to the first supply voltage $V_1$, and a drain electrically connected to the first end of the first Miller capacitor 5. Additionally, the second PMOS cascode transistor 62 includes a source electrically connected to the drain of the second PMOS input transistor 14, a gate electrically connected to the first supply voltage $V_1$, and a drain electrically connected to the first end of the second Miller capacitor 6.

The first and second cascode transistors 61, 62 can be used to boost the output impedance of the comparator stage 60 of FIG. 3 relative to the first comparator stage 1 of FIG. 1. Increasing the output impedance of the comparator stage 60 can improve the performance of a comparator by increasing the comparator stage's maximum available gain. For example, the output voltage of a comparator stage can be clamped or limited to about $I_{OUT}*R_{OUT}$, where $I_{OUT}$ is the output current of the comparator stage and $R_{OUT}$ is the output impedance of the comparator stage. Thus, configuring the comparator stage 60 with a high output impedance can aid in providing a large maximum available gain. Although the gates of the first and second PMOS cascode transistors 61, 62 are illustrated as being connected to the first supply voltage $V_1$, other configurations are possible, such as implementations in which the gates are controlled to an analog bias voltage.

As described earlier, the first and second Miller capacitors 5, 6 can be used to extend integration time by a factor of about $(V_2-V_1+V_T)/V_T$, where $V_2$ is the voltage of the second supply voltage $V_2$, $V_1$ is the voltage of the first supply voltage $V_1$, and $V_T$ is the trip point of the first and second inverters 7, 8. Extending the integration time can also increase the gain of a comparator stage, particularly in configurations in which cascode transistors are used to increase the maximum available gain of the comparator stage. For example, in certain implementations, the comparator stage 60 can have a gain A that can be approximated using Equation 1 below, in which $V_2$, $V_1$, and $V_T$ are defined as above, and in which $g_m$ is the transconductance of the first and second PMOS input transistors 13, 14, I is the bias current of the first PMOS current source transistor 63, $C_M$ is the capacitance of the first and second Miller capacitors 5, 6, and $C_L$ is the non-Miller parasitic load capacitance associated with the output nodes that generate the first non-inverted and first inverted output signals $V_{P2}$, $V_{N1}$, respectfully.

$$A \sim = \frac{g_m * V_T}{I}\left[1 + \left(\frac{C_M}{C_L + C_M}\right)\left(\frac{V_2 - V_1}{V_T}\right)\right] \quad \text{Equation 1}$$

Using Miller capacitors to increase a comparator stage's gain can provide numerous advantages, such as an overall increase the speed of a comparator using the comparator stage. Additionally, configuring a comparator stage with high gain can also reduce the offset and noise contributed by a subsequent comparator stage.

The second PMOS current source transistor 64 can be used to provide a relatively small current, which can operate to initially charge the source nodes of the first and second PMOS cascode transistors 61, 62. Including the second PMOS current source transistor 64 can reduce a comparator's input offset voltage. For example, when the first and second PMOS cascode transistors 61, 62 have mismatched threshold voltages and the second PMOS current source transistor 64 is omitted, the sources nodes of the first and second PMOS cascode transistors 61, 62 can have different initial source voltages, which can result in the comparator having a corresponding input offset error. In one embodiment, the second PMOS current source transistor 64 is a scaled replica of the first PMOS current source transistor 63.

Figure 5:
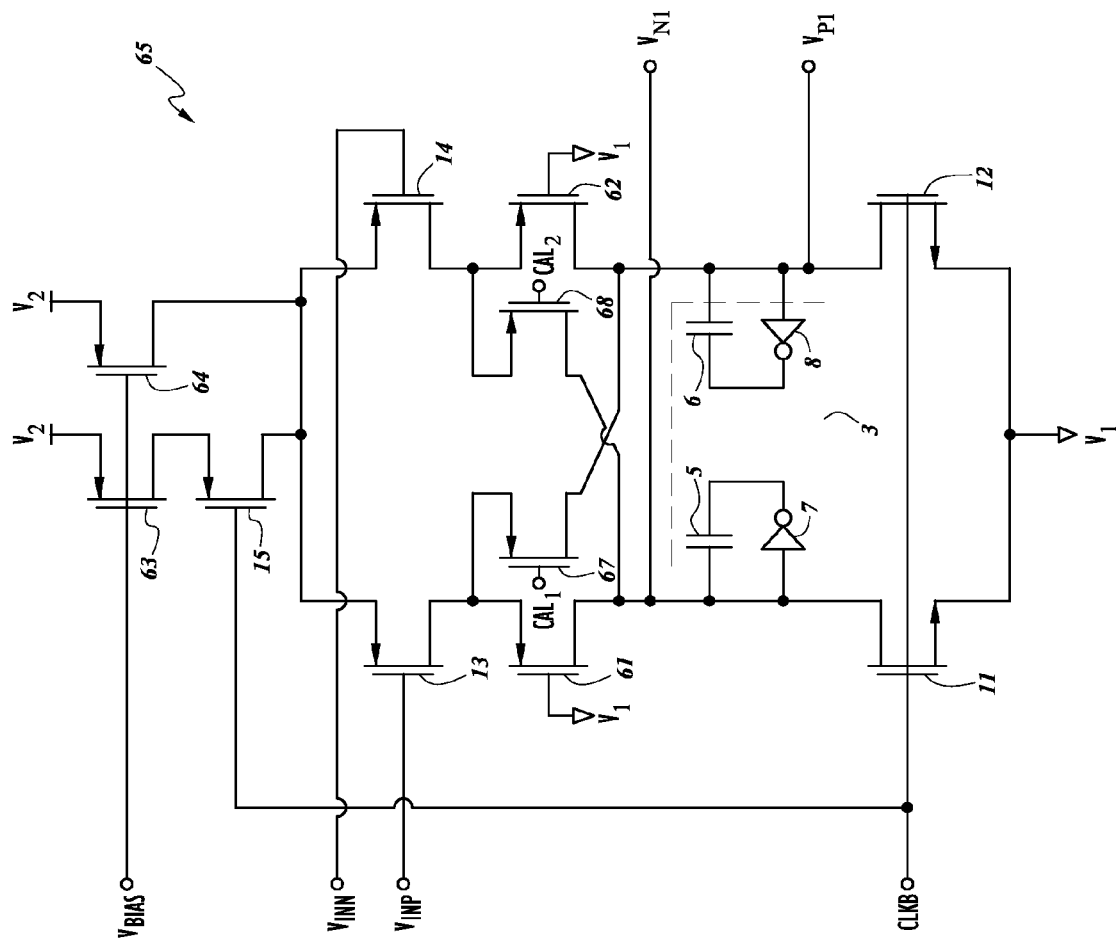
FIG. 5 is a circuit diagram of another embodiment of a comparator stage.

FIG. 5 is a circuit diagram of another embodiment of a comparator stage 65. The comparator stage 65 of FIG. 5 is similar to the comparator stage 60 of FIG. 4, except that the comparator stage 65 further includes a first PMOS calibration transistor 67 and a second PMOS calibration transistor 68.

The first PMOS calibration transistor 67 includes a source electrically connected to the source of the first PMOS cascode transistor 61, a drain electrically connected to a drain of the second PMOS cascode transistor 62, and a gate that receives a first calibration signal CAL. Additionally, the second PMOS calibration transistor 68 includes a source electrically connected to the source of the second PMOS cascode transistor 62, a drain electrically connected to a drain of the first PMOS cascode transistor 61, and a gate that receives a second calibration signal $CAL_2$.

The first and second PMOS calibration transistors 67, 68 can be used to calibrate an input offset of the comparator stage 65. For example, when the first and second calibration signals $CAL_1$, $CAL_2$ are both high, the first and second PMOS calibration transistors 67, 68 can be turned off. However, when the first calibration signal $CAL_1$ is low and the second calibration signal $CAL_2$ is high, a portion of the current through the first PMOS input transistor 13 can be steered to the second Miller capacitor 6, thereby effectively adding negative offset to the comparator. Additionally, when the second calibration signal $CAL_2$ is low and the first calibration signal $CAL_1$ is high, a portion of the current through the second PMOS input transistor 14 can be steered to the first Miller capacitor 5, thereby effectively adding positive offset to the comparator.

Accordingly, the first and second PMOS calibration transistors 67, 68 can be used to increase or decrease the offset of the comparator stage 65, and thus can be used to cancel input offset of the comparator stage 65. Although FIG. 5 illustrates a configuration using one pair of calibration transistors, additional pairs of calibration transistors can be added to provide further control over the input offset. For example, in certain implementations each pair of calibration transistors can be separately controlled so as to achieve a desired positive or negative offset correction. In certain implementations, each pair of calibration transistors has a different weight or strength. As shown in FIG. 5, the comparator stage 65 can have an input offset that is controlled using a relatively small number of offset trimming or calibration transistors. Thus, the comparator stage 65 can avoid a need to use more complex background offset calibration circuitry, which can occupy a relative large amount of IC area and can contribute to noise.

Figure 6:
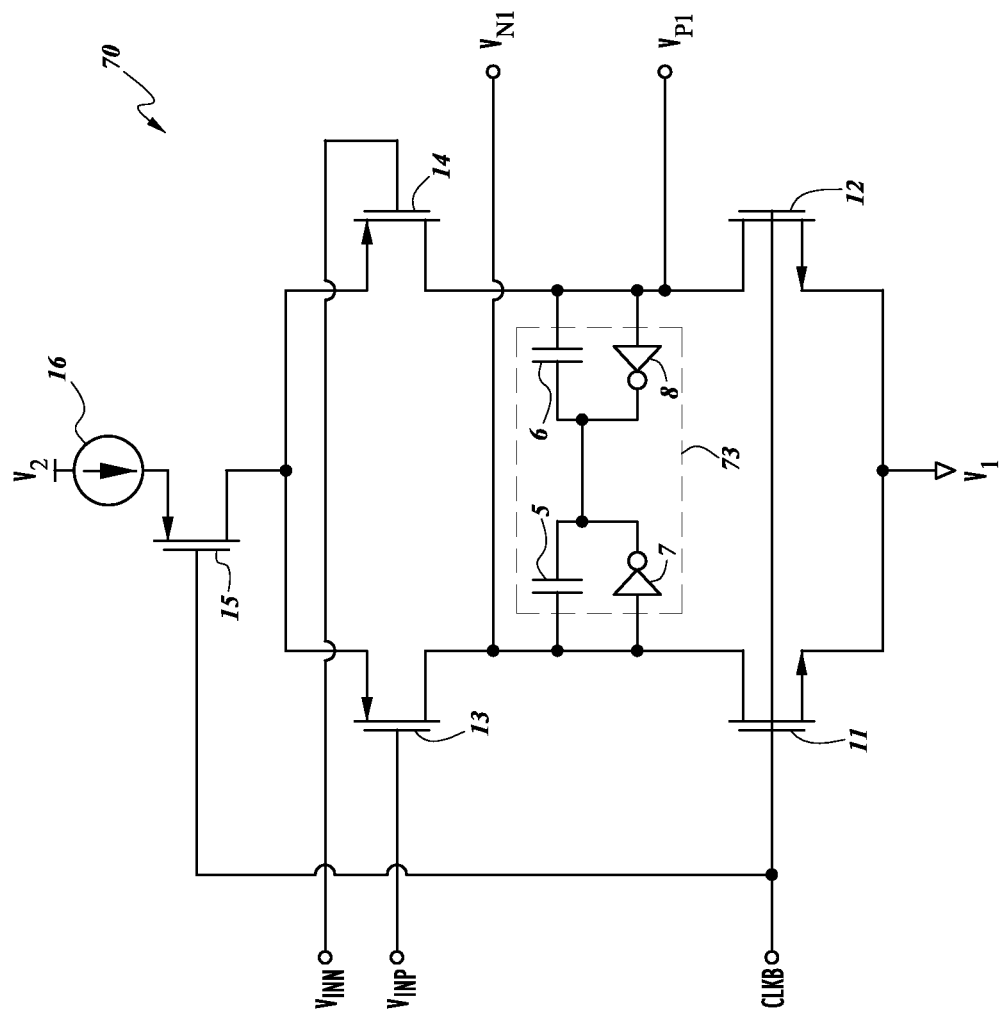
FIG. 6 is a circuit diagram of another embodiment of a comparator stage.

FIG. 6 is a circuit diagram of another embodiment of a comparator stage 70. The comparator stage 70 of FIG. 6 is similar to the first comparator stage 1 of FIG. 1, except that the comparator stage 70 includes a different configuration of a Miller circuit. In particular, the comparator stage 70 includes a Miller circuit 73 in which the output of the first inverter 7 is electrically connected to the output of the second inverter 8, to the second end of the first Miller capacitor 5, and to the second end of the second Miller capacitor 6.

The Miller circuit configuration shown in FIG. 6 can be used in certain comparators. However, the comparator stage 70 can also suffer from noise associated with capacitive coupling. For example, when the first inverter 7 activates and transitions from high to low and when the second input voltage $V_{INN}$ is relatively high such that the second PMOS input transistor 14 is off or almost off, capacitive coupling associated with the second Miller capacitor 6 can cause the voltage of the first non-inverted output signal $V_{P1}$ to decrease, even to a voltage below that of the first supply voltage $V_1$. Similarly, when the second inverter 8 activates and transitions from high to low and when the first input voltage $V_{INP}$ is relatively high such that the first PMOS input transistor 13 is off or almost off, capacitive coupling associated with the first Miller capacitor 5 can cause the voltage of the first inverted output signal $V_{N1}$ to decrease. Additional details of the comparator stage 70 can be similar to those described earlier.

Figure 7:
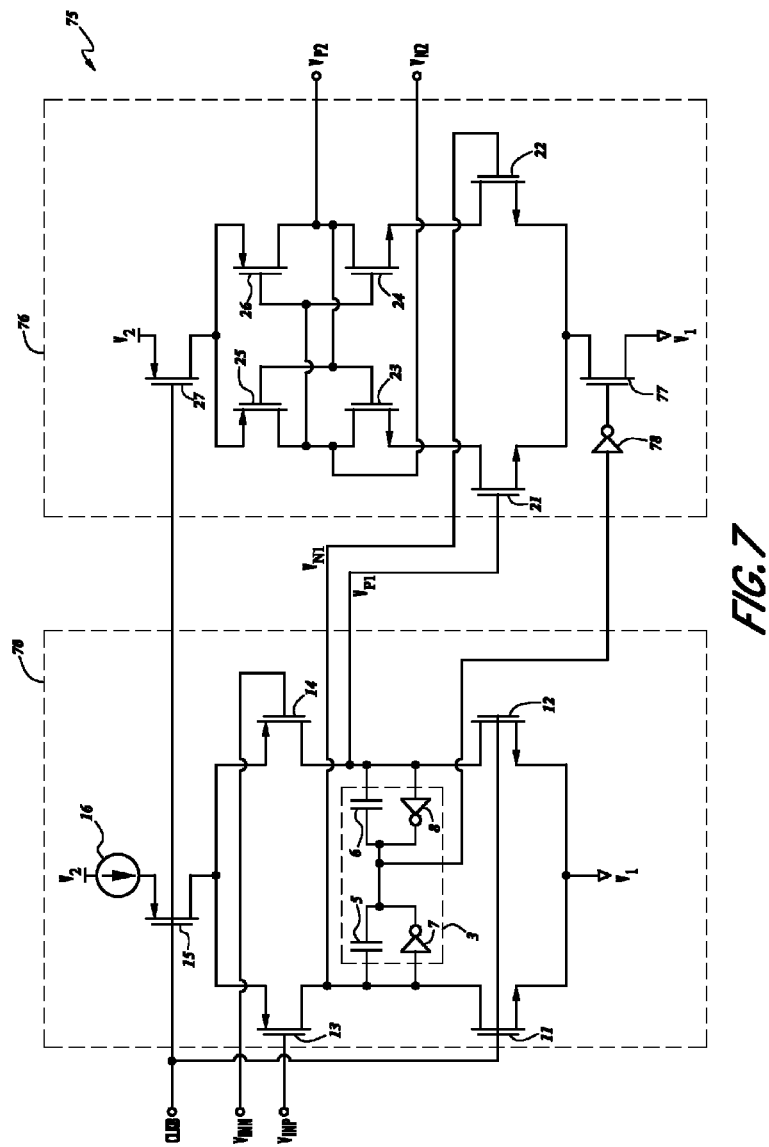
FIG. 7 is a circuit diagram of another embodiment of a comparator.

FIG. 7 is a circuit diagram of another embodiment of a comparator 75. The comparator 75 includes the first comparator stage 70, which can be as described above with respect to FIG. 6. The comparator 75 further includes a second comparator stage 76, which can be similar to the second comparator stage 2 of FIG. 1, except that the second comparator stage 76 of FIG. 7 further includes an NMOS clocked transistor 77 and a third inverter 78.

The NMOS clocked transistor 77 includes a source electrically connected to the first supply voltage $V_1$, a gate electrically connected to an output of the third inverter 78, and a drain electrically connected to sources of the first and second NMOS input transistors 21, 22. The third inverter 78 further includes an input electrically connected to the second ends of the first and second Miller capacitors 5, 6 and to the outputs of the first and second inverters 7, 8.

The NMOS clocked transistor 77 and the third inverter 78 can be used to activate the second comparator stage 76 once the comparator's Miller phase is complete. For example, the NMOS clocked transistor 77 can turn on and activate the second comparator stage 76 after the first or second inverters 7, 8 of the first comparator stage 70 have transitioned. Additional details of the comparator 75 can be similar to those described earlier.

Figure 8:
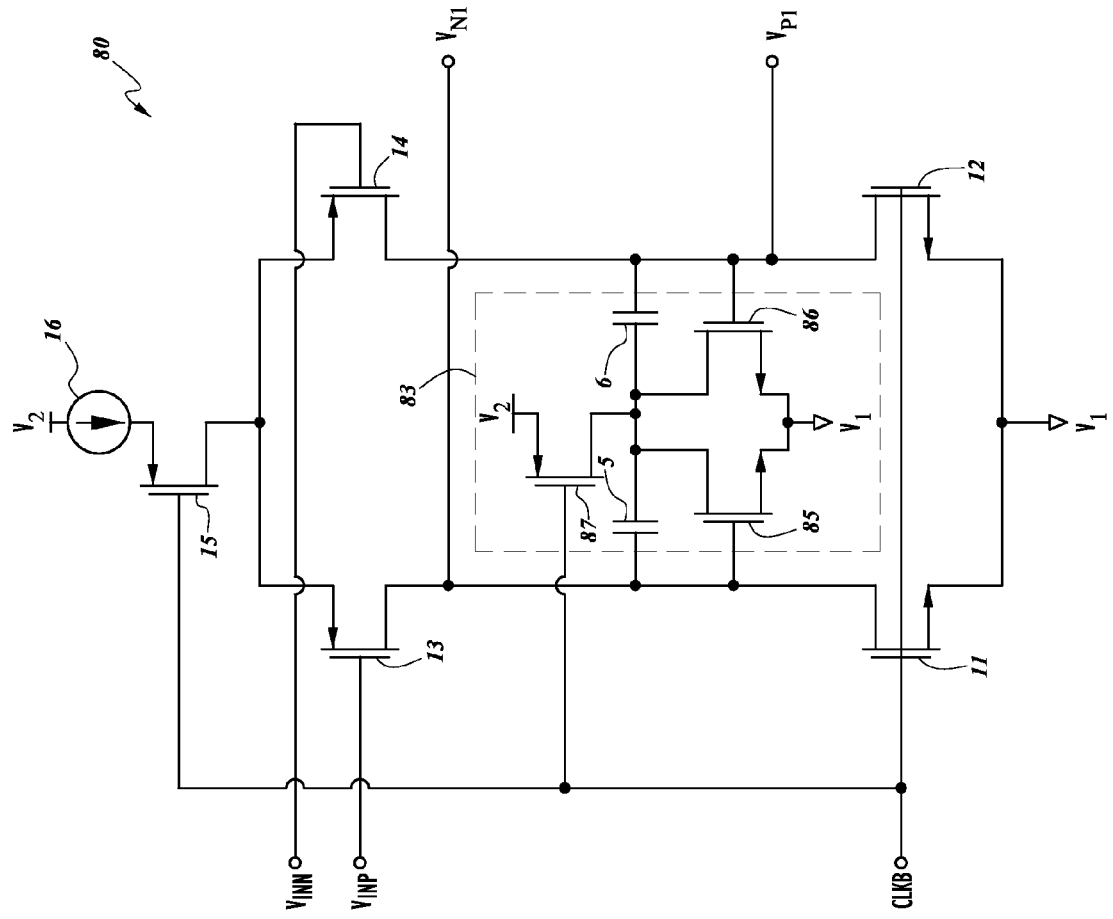
FIG. 8 is a circuit diagram of another embodiment of a comparator stage.

FIG. 8 is a circuit diagram of another embodiment of a comparator stage 80. The comparator stage 80 is similar to the first comparator stage 1 of FIG. 1, except that the comparator stage 80 includes a Miller circuit including a different arrangement of inverting amplification circuits.

For example, the comparator stage 80 includes a Miller circuit 83 that includes first and second Miller capacitors 5, 6, a first NMOS transistor 85, a second NMOS transistor 86, and a PMOS reset transistor 87. The first NMOS transistor 85 includes a gate electrically connected to a first end of the first Miller capacitor 5, a source electrically connected to the first supply voltage $V_1$, and a drain electrically connected to a drain of the second NMOS transistor 86, to a drain of the PMOS reset transistor 87, to a second end of the first Miller capacitor 5, and to a second end of the second Miller capacitor 6. The second NMOS transistor 86 further includes a gate electrically connected to a first end of the second Miller capacitor 6 and a source electrically connected to the first supply voltage $V_1$. The PMOS reset transistor 87 further includes a gate configured to receive the inverted clock signal CLKB and a source electrically connected to the second supply voltage $V_2$.

The first and second NMOS transistors 85, 86 can be configured to have a threshold voltage that is less than a threshold voltage of NMOS input transistors associated with a second comparator stage. For example, when the comparator stage 80 is used to drive the second comparator stage 2 of FIG. 1, the first and second NMOS transistors 85, 86 can have a threshold voltage less than that of the first and second NMOS input transistors 21, 22. Configuring the first and second NMOS transistors 85, 86 in this manner can aid in preventing a second comparator stage from activating during a comparator's Miller phase.

Figure 9:
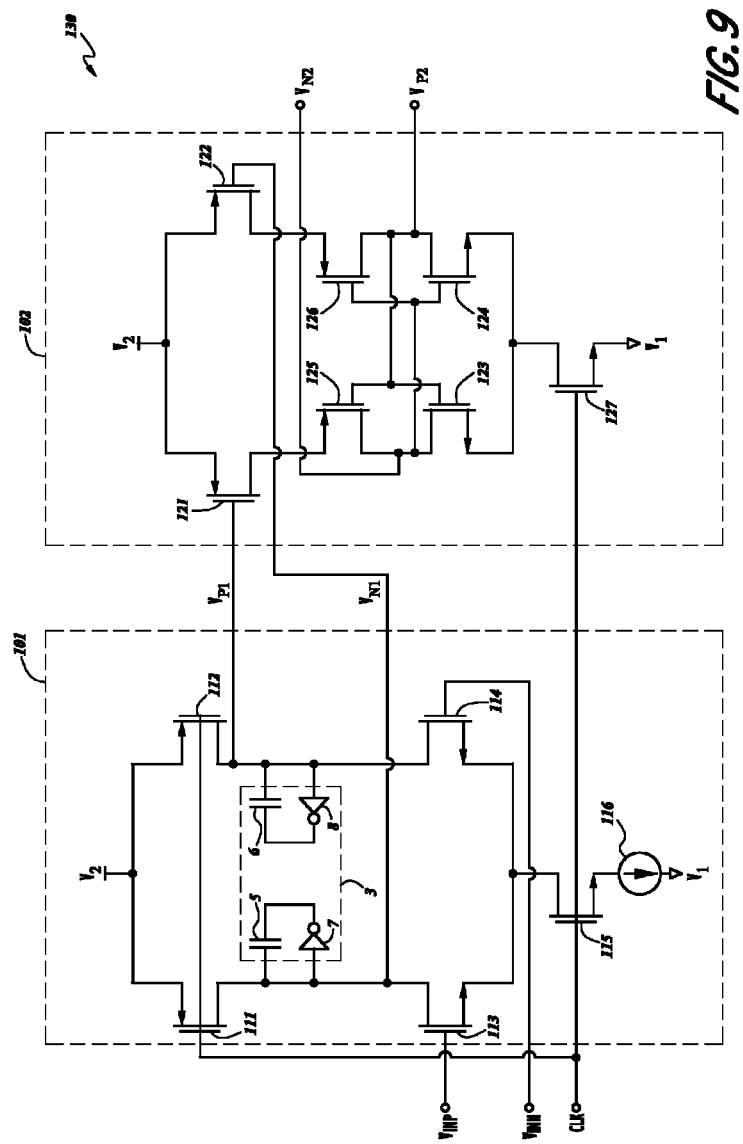
FIG. 9 is a circuit diagram of another embodiment of a comparator.

FIG. 9 is a circuit diagram of another embodiment of a comparator 130. The comparator 130 includes a first comparator stage 101 and a second comparator stage 102. The first comparator stage 101 is configured to receive the first and second input voltages $V_{INP}$, $V_{INN}$, and to generate the first differential output signal ($V_{P1}-V_{N1}$). The second comparator stage 102 is configured to receive the first differential output signal ($V_{P1}-V_{N1}$) and to generate a second differential output signal ($V_{P2}-V_{N2}$).

The first comparator stage 101 includes the Miller circuit 3, which includes the first and second Miller capacitors 5, 6 and the first and second inverters 7, 8. The first comparator stage 101 further includes a first PMOS precharge transistor 111, a second PMOS precharge transistor 112, a first NMOS input transistor 113, a second NMOS input transistor 114, a first NMOS clocked transistor 115, and a current source 116. The first NMOS input transistor 113 includes a gate configured to receive the first input voltage $V_{INP}$, and the second NMOS input transistor 114 includes a gate configured to receive the second input voltage $V_{INN}$. The first NMOS input transistor 113 further includes a drain electrically connected to an input of the first inverter 7, to a first end of the first Miller capacitor 5, and to a drain of the first PMOS precharge transistor 111 at a node configured to generate the first inverted output signal $V_{N1}$. The first inverter 7 further includes an output electrically connected to a second end of the first Miller capacitor 5. The second NMOS input transistor 114 further includes a drain electrically connected to an input of the second inverter 8, to a first end of the second Miller capacitor 6, and to a drain of the second PMOS precharge transistor 112 at a node configured to generate the first non-inverted output signal $V_{P1}$. The second inverter 8 further includes an output electrically connected to a second end of the second Miller capacitor 6. The first and second PMOS precharge transistors 111, 112 each further include a gate configured to receive a clock signal CLK and a source electrically connected to the second supply voltage $V_2$. The first NMOS clocked transistor 115 includes a drain electrically connected to a source of the first NMOS input transistor 113 and to a source of the second NMOS input transistor 114. The first NMOS clocked transistor 115 further includes a gate configured to receive the clock signal CLK and a source electrically connected to a first terminal of the current source 116. The current source 116 further includes a second terminal electrically connected to the first supply voltage $V_1$.

The second comparator stage 102 includes a first PMOS input transistor 121, a second PMOS input transistor 122, first and second NMOS output transistors 123, 124, first and second PMOS output transistors 125, 126, and a second NMOS clocked transistor 127. The first PMOS input transistor 121 includes a source electrically connected to the second supply voltage $V_2$, a gate configured to receive the first non-inverted output signal $V_{P1}$, and a drain electrically connected to a source of the first PMOS output transistor 125. The second PMOS input transistor 122 includes a source electrically connected to the second supply voltage $V_2$, a gate configured to receive the first inverted output signal $V_{N1}$, and a drain electrically connected to a source of the second PMOS output transistor 126. The second NMOS clocked transistor 127 includes a source electrically connected to the first supply voltage $V_1$, a gate configured to receive the clock signal CLK, and a drain electrically connected to a source of the first NMOS output transistor 123 and to a source of the second NMOS output transistor 124. The first PMOS output transistor 125 further includes a drain electrically connected to a drain of the first NMOS output transistor 123, to a gate of the second NMOS output transistor 124, and to a gate of the second PMOS output transistor 126 at a node configured to generate the second inverted output signal $V_{N2}$. The second PMOS output transistor 126 further includes a drain electrically connected to a drain of the second NMOS output transistor 124, to a gate of the first NMOS output transistor 123, and to a gate of the first PMOS output transistor 125 at a node configured to generate the second non-inverted output signal $V_{P2}$.

The comparator 130 of FIG. 9 is a complementary implementation of the comparator 30 of FIG. 1. For example, the comparator 130 of FIG. 9 has a similar circuit topology as the comparator 30 of FIG. 1, but uses devices of opposite polarity. For instance, the first comparator stage 101 of FIG. 9 includes first and second NMOS input transistors 113, 114, while the first comparator stage 1 of FIG. 1 includes first and second PMOS input transistors 13, 14. In certain implementation, the comparator 130 of FIG. 9 can have higher gain than the comparator 30 of FIG. 1, since the first and second NMOS input transistors 113, 114 can have a higher gain that then the first and second PMOS input transistors 13, 14 due to the higher carrier mobility of electrons relative to holes. However, the comparator 30 of FIG. 1 can be advantageous in certain configurations, such as implementations in which the input common mode voltage of the first and second input voltage $V_{INP}$, $V_{INN}$ is relatively low, such as a voltage that is relatively close to the voltage of the first supply voltage $V_1$.

Although only a complementary configuration of the comparator 30 of FIG. 1 has been illustrated, any of the comparators described herein can be implemented using n-type or p-type input transistors. Accordingly, the teachings herein are also applicable to complementary configurations of the comparators or comparator stages shown in FIGS. 3-8.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, medical electronic products, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. The medical electronic products can include, but are not limited to, a Digital-X-ray detector, a CT (Computed Tomography) scanner, an Ultrasounds system, a MRI (Magnetic Resonance Imaging) system, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A comparator, comprising:
a first comparator stage configured to receive a first input voltage and a second input voltage, the first comparator stage comprising:
    a first input transistor, wherein a gate of the first input transistor is configured to receive the first input voltage;
    a second input transistor, wherein a gate of the second input transistor is configured to receive the second input voltage, and wherein a source of the first input transistor is electrically connected to a source of the second input transistor;
    a first inverting gain circuit including an input and an output, wherein the input of the first inverting gain circuit is electrically connected to a drain of the first input transistor;
    a first capacitor having a first end electrically connected to the drain of the first input transistor and a second end electrically connected to the output of the first inverting gain circuit;
    a second inverting gain circuit including an input and an output, wherein the input of the second inverting gain circuit is electrically connected to a drain of the second input transistor;
    a second capacitor having a first end electrically connected to the drain of the second input transistor and a second end electrically connected to the output of the second inverting gain circuit;
    a first cascode transistor electrically connected in a signal path between the drain of the first input transistor and the first end of the first capacitor; and
    a second cascode transistor electrically connected in a signal path between the drain of the second input transistor and the first end of the second capacitor.

2. A comparator, comprising:
a first comparator stage configured to receive a first input voltage and a second input voltage, the first comparator stage comprising:
    a first input transistor, wherein a gate of the first input transistor is configured to receive the first input voltage;
    a second input transistor, wherein a gate of the second input transistor is configured to receive the second input voltage, and wherein a source of the first input transistor is electrically connected to a source of the second input transistor;
    a first inverting gain circuit including an input and an output, wherein the input of the first inverting gain circuit is electrically connected to a drain of the first input transistor;
    a first capacitor having a first end electrically connected to the drain of the first input transistor and a second end electrically connected to the output of the first inverting gain circuit;
    a second inverting gain circuit including an input and an output, wherein the input of the second inverting gain circuit is electrically connected to a drain of the second input transistor; and
    a second capacitor having a first end electrically connected to the drain of the second input transistor and a second end electrically connected to the output of the second inverting gain circuit,
wherein the first comparator stage further comprises a timing transistor and a current source, wherein the timing transistor includes a source electrically connected to the current source, a drain electrically connected to the sources of the first and second input transistors, and a gate configured to receive a clock signal.

3. The comparator of claim 1 wherein the first comparator stage further comprises:
a first calibration transistor having a gate configured to receive a first input offset calibration signal, a source electrically connected to a source of the first cascode transistor, and a drain electrically connected to a drain of the second cascode transistor; and
a second calibration transistor having a gate configured to receive a second input offset calibration signal, a source electrically connected to a source of the second cascode transistor, and a drain electrically connected to a drain of the first cascode transistor.

4. The comparator of claim 1, further comprising:
a current source transistor including a gate configured to receive a bias voltage, a source electrically connected to a power high supply, and a drain electrically connected to the sources of the first and second input transistors, wherein the current source transistor is configured to provide a charging current for charging the source nodes of the first and second calibration transistors.

5. A comparator, comprising:
a first comparator stage configured to receive a first input voltage and a second input voltage, the first comparator stage comprising:
    a first input transistor, wherein a gate of the first input transistor is configured to receive the first input voltage;
    a second input transistor, wherein a gate of the second input transistor is configured to receive the second input voltage, and wherein a source of the first input transistor is electrically connected to a source of the second input transistor;

a first inverting gain circuit including an input and an output, wherein the input of the first inverting gain circuit is electrically connected to a drain of the first input transistor;

a first capacitor having a first end electrically connected to the drain of the first input transistor and a second end electrically connected to the output of the first inverting gain circuit;

a second inverting gain circuit including an input and an output, wherein the input of the second inverting gain circuit is electrically connected to a drain of the second input transistor;

a second capacitor having a first end electrically connected to the drain of the second input transistor and a second end electrically connected to the output of the second inverting gain circuit;

a first precharge transistor including a drain electrically connected to the drain of the first input transistor, a source electrically connected to a first supply voltage, and a gate configured to receive a clock signal; and a second precharge transistor, wherein the second precharge transistor includes a drain electrically connected to the drain of the second input transistor, a source electrically connected to the first supply voltage, and a gate configured to receive the clock signal.

6. The comparator of claim 1, further comprising:
a second comparator stage comprising:
   a third input transistor, wherein a gate of the third input transistor is electrically connected to the drain of the second input transistor; and
   a fourth input transistor, wherein a gate of the fourth input transistor is electrically connected to the drain of the first input transistor.

7. A comparator, comprising:
a first comparator stage configured to receive a first input voltage and a second input voltage, the first comparator stage comprising:
   a first input transistor, wherein a gate of the first input transistor is configured to receive the first input voltage;
   a second input transistor, wherein a gate of the second input transistor is configured to receive the second input voltage, and wherein a source of the first input transistor is electrically connected to a source of the second input transistor;
   a first inverting gain circuit including an input and an output, wherein the input of the first inverting gain circuit is electrically connected to a drain of the first input transistor;
   a first capacitor having a first end electrically connected to the drain of the first input transistor and a second end electrically connected to the output of the first inverting gain circuit;
   a second inverting gain circuit including an input and an output, wherein the input of the second inverting gain circuit is electrically connected to a drain of the second input transistor; and
   a second capacitor having a first end electrically connected to the drain of the second input transistor and a second end electrically connected to the output of the second inverting gain circuit, a second comparator stage comprising:
   a third input transistor, wherein a gate of the third input transistor is electrically connected to the drain of the second input transistor; and
   a fourth input transistor, wherein a gate of the fourth input transistor is electrically connected to the drain of the first input transistor,
   wherein the third and fourth input transistors have a threshold voltage that is greater than a trip point of the first and second inverting gain circuits.

8. The comparator of claim 6, wherein a source of the third input transistor is electrically connected to a source of the fourth input transistor.

9. The comparator of claim 6, wherein a source of the third input transistor is electrically connected to the output of the second inverting gain circuit, and wherein a source of the fourth input transistor is electrically connected to the output of the first inverting gain circuit.

10. The comparator of claim 6, wherein the first and second input transistors are p-type transistors and the third and fourth input transistors are n-type transistors.

11. The comparator of claim 10, wherein the second comparator stage further comprises:
   a first n-type output transistor including a source electrically connected to a drain of the third input transistor;
   a second n-type output transistor including a source electrically connected to a drain of the fourth input transistor;
   a first p-type output transistor including a drain electrically connected to a drain of the first n-type output transistor and a gate electrically connected to a gate of the first n-type output transistor and to a drain of the second n-type output transistor; and
   a second p-type output transistor including a drain electrically connected to the drain of the second n-type output transistor and a gate electrically connected to a gate of the second n-type output transistor and to a drain of the first n-type output transistor.

12. The comparator of claim 1,
wherein the first inverting gain circuit comprises a first gain transistor including a gate configured to operate as the input of the first inverting gain circuit, a drain configured to operate as the output of the first inverting gain circuit, and a source electrically connected to a first supply voltage, and
wherein the second inverting gain circuit comprises a second gain transistor including a gate configured to operate as the input of the second inverting gain circuit, a drain configured to operate as the output of the second inverting gain circuit, and a source electrically connected to the first supply voltage.

13. The comparator of claim 12, further comprising a reset transistor including a gate configured to receive a clock signal, a source electrically connected to a second supply voltage, and a drain electrically connected to the drains of the first and second gain transistors.

14. The comparator of claim 1,
wherein the first inverting gain circuit comprises a first inverter including an input configured to operate as the input of the first inverting gain circuit and an output configured to operate as the output of the first inverting gain circuit, and
wherein the second inverting gain circuit comprises a second inverter including an input configured to operate as the input of the second inverting gain circuit and an output configured to operate as the output of the second inverting gain circuit.

15. An analog-to-digital converter comprising:
a comparator configured to receive a first input voltage and
a second input voltage, the comparator comprising:
a first input transistor, wherein a gate of the first input transistor is configured to receive the first input voltage;
a second input transistor, wherein a gate of the second input transistor is configured to receive the second input voltage, and wherein a source of the first input transistor is electrically connected to a source of the second input transistor;
a first inverting gain circuit including an input and an output, wherein the input of the first inverting gain circuit is electrically connected to a drain of the first input transistor;
a first capacitor having a first end electrically connected to the drain of the first input transistor and a second end electrically connected to the output of the first inverting gain circuit;
a second inverting gain circuit including an input and an output, wherein the input of the second inverting gain circuit is electrically connected to a drain of the second input transistor;
a second capacitor having a first end electrically connected to the drain of the second input transistor and a second end electrically connected to the output of the second inverting gain circuit;
a first cascode transistor electrically connected in a signal path between the drain of the first input transistor and the first end of the first capacitor; and
a second cascode transistor electrically connected in a signal path between the drain of the second input transistor and the first end of the second capacitor.

16. The analog-to-digital converter of claim 15, wherein the comparator further comprises a timing transistor and a current source, wherein the timing transistor includes a source electrically connected to the current source, a drain electrically connected to the sources of the first and second input transistors, and a gate configured to receive a clock signal.

17. The analog-to-digital converter of claim 15, wherein the comparator further comprises:
a first calibration transistor having a gate configured to receive a first input offset calibration signal, a source electrically connected to a source of the first cascode transistor, and a drain electrically connected to a drain of the second cascode transistor; and
a second calibration transistor having a gate configured to receive a second input offset calibration signal, a source electrically connected to a source of the second cascode transistor, and a drain electrically connected to a drain of the first cascode transistor.

18. The analog-to-digital converter of claim 17, wherein the first input transistor, the second input transistor, the first cascode transistor, the second cascode transistor, the first calibration transistor, and the second calibration transistor are p-type transistors.

19. The analog-to-digital converter of claim 17, wherein the comparator further comprises:
a current source transistor including a gate configured to receive a bias voltage, a source electrically connected to a power high supply, and a drain electrically connected to the sources of the first and second input transistors, wherein the current source transistor is configured to provide a charging current for charging the source nodes of the first and second calibration transistors.

20. The analog-to-digital converter of claim 15, wherein the comparator further comprises:
a first precharge transistor including a drain electrically connected to the drain of the first input transistor, a source electrically connected to a first supply voltage, and a gate configured to receive a clock signal; and
a second precharge transistor, wherein the second precharge transistor includes a drain electrically connected to the drain of the second input transistor, a source electrically connected to the first supply voltage, and a gate configured to receive the clock signal.

21. The analog-to-digital converter of claim 15, wherein the comparator further comprises:
a third input transistor, wherein a gate of the third input transistor is electrically connected to the drain of the second input transistor; and
a fourth input transistor, wherein a gate of the fourth input transistor is electrically connected to the drain of the first input transistor,
wherein the third and fourth input transistors have a threshold voltage that is greater than a trip point of the first and second inverting gain circuits.

* * * * *